United States Patent [19]

Kordina et al.

[11] Patent Number: 5,792,257
[45] Date of Patent: Aug. 11, 1998

[54] METHOD FOR PROTECTING THE SUSCEPTOR DURING EPITAXIAL GROWTH BY CVD AND A DEVICE FOR EPITAXIAL GROWTH BY CVD

[75] Inventors: Olle Kordina, Sturefors; Christer Hallin, Linköping; Erik Janzén, Borensberg, all of Sweden

[73] Assignee: ABB Research Ltd., Zurich, Switzerland

[21] Appl. No.: 421,879

[22] Filed: Apr. 14, 1995

[30] Foreign Application Priority Data

Jan. 31, 1995 [SE] Sweden .................... 9500326

[51] Int. Cl.[6] .................................... C30B 25/12
[52] U.S. Cl. .................. 117/90; 117/95; 117/200; 117/900
[58] Field of Search ............... 117/90, 95, 200, 117/900; 118/725, 718

[56] References Cited

U.S. PATENT DOCUMENTS

| 4,446,817 | 5/1984 | Crawley | 118/725 |
|---|---|---|---|
| 5,119,541 | 6/1992 | Ohmi et al. | 118/725 |
| 5,363,800 | 11/1994 | Larkin et al. | 117/95 |
| 5,549,749 | 8/1996 | Asai | 117/95 |

FOREIGN PATENT DOCUMENTS

| 0175436 | 3/1986 | European Pat. Off. |
| 0269439 | 6/1988 | European Pat. Off. |
| 54-34757 | 3/1979 | Japan. |
| 3-69113 | 3/1991 | Japan. |
| 8810324 | 12/1988 | WIPO. |

OTHER PUBLICATIONS

A Novel Hot-Wall CVD Reactor for SiC Epitaxy, Kordina et al., Inst. Phys. Conf. Ser. No. 137, Chapter 1, paper presented at 5th SiC and Related Materials Conf., Washington, DC 1993.

*Primary Examiner*—Robert Kunemund
*Attorney, Agent, or Firm*—Pollock, Vande Sande & Priddy

[57] ABSTRACT

A method for protecting a susceptor when SiC, a Group III-nitride or alloys thereof, is epitaxially grown by chemical vapor deposition on a substrate arranged on a surface of the susceptor includes the steps of heating the susceptor and thus the substrate and a gas mixture fed to the substrate for the growth, placing a plate made of SiC, an alloy of SiC and the material grown, or the material grown, on the susceptor and arranging the substrate on the plate.

18 Claims, 1 Drawing Sheet

5,792,257

METHOD FOR PROTECTING THE SUSCEPTOR DURING EPITAXIAL GROWTH BY CVD AND A DEVICE FOR EPITAXIAL GROWTH BY CVD

FIELD OF THE INVENTION

The present invention relates to a method for protecting a susceptor when SiC, a Group III-nitride or alloys thereof is epitaxially grown by Chemical Vapor Deposition on a substrate arranged on a surface of the susceptor, the substrate and a gas mixture fed to the substrate for the growth being heated through heating of the susceptor. This invention also relates to a device for epitaxially growing such a crystal by Chemical Vapor Deposition on a substrate.

The invention is applicable to the growth of SiC, Group III-nitrides, and all types of alloys thereof, but the common problem of growing such crystals of a high quality will now, by way of a non-limitative example, be further explained particularly for SiC.

SiC single crystals are, in particular, grown for use in different types of semiconductor devices, such as, for example, different types of diodes, transistors and thyristors, intended for applications in which it is possible to benefit from the superior properties of SiC in comparison especially with Si, namely the capability of SiC to function well under extreme conditions. The large band gap between the valence band and the conduction band of SiC makes devices fabricated from the material able to operate at high temperatures, namely up to 1000K.

High temperatures are needed for obtaining a good ordered growth of SiC. The epitaxial growth of silicon carbide by Chemical Vapor Deposition is therefore carried out in a temperature regime in excess of 1400° C. These high temperatures are needed both to obtain decomposition by cracking of the Si- and C-containing precursor gases of the gas mixture and to ensure that the atoms are deposited on the substrate surface in an orderly manner. High temperatures also result in problems with impurities coming out of different types of materials, so that the selection of suitable materials withstanding the high temperatures is crucial to prevent unwanted impurities to be incorporated in the layers of the SiC crystal grown.

Graphite is, at present, the most suited susceptor-material on account of its comparably high purity, its availability in different sizes and shapes, and its resistivity which makes it easy to heat. However, it has been shown that unprotected graphite is not suitable for SiC epitaxy by Chemical Vapor Deposition. Hydro-carbons will be produced through a reaction between the hydrogen carrier gas contained in said gas mixture and the graphite susceptor surface, which will change the input ratio of carbon and silicon (C/Si ratio) of the precursor gases of said gas mixture. In addition, the impurities (mainly boron and aluminium) present in the graphite will be incorporated in the epitaxial layers. The same problem still exists when metal is used as susceptor material, the only difference being that other types of impurities are then released due to the high temperatures required.

This problem has been solved for the graphite susceptor case by using a SiC-coated graphite as susceptor for the growth of high purity SiC films. SiC is chosen due to its ability to withstand high temperatures and the fact that it would not constitute an impurity if it were mixed with the gas mixture after sublimation. The coating provides a substantial protection from impurities and changes in the C/Si ratio. Due to the high temperatures employed during the epitaxy, the SiC coating underneath the substrate will be etched or sublimed and deposited on the backside of the somewhat colder substrate. This sublimation takes place because of the temperature gradient between the susceptor and the substrate, and the precursor gases do not reach the SiC coating underneath the substrate and may not interact therewith to obtain a suitable equilibrium between deposition and sublimation on and from the SiC coating as in other regions thereof.

This effect of etching or sublimation of the SiC coating underneath the substrate may be counteracted by the use of a so called hot-wall reactor by arranging the substrate in a channel of a susceptor and heating the walls of the susceptor surrounding the channel, so that the temperature gradient between the substrate and the susceptor surface is smaller than in a conventional cold-wall or warm-wall reactor. This does however only slow down the effect, but the problem is still there and it will limit the lifetime of the susceptor. Thus, it will be necessary to change the susceptor after a certain period of time, since impurities will otherwise come out of the susceptor and be incorporated in the epitaxial layers with the result that the Si/C ratio will be changed in the reactor.

The corresponding problem is there when a metal susceptor is used and coated with a SiC film for the same reason as for graphite. The problem is also there when single crystals of high quality of any Group III-nitride, an alloy of Group III-nitrides or an alloy of SiC and one or more Group III-nitrides is to be epitaxially grown by the CVD technique. In some cases the temperature is lower and therefore the impurity problems due to high temperatures is not as accentuated as for SiC, but the problems with etching of the susceptor or a protective coating thereof and a possible sublimation of such a coating underneath the substrate remain.

SUMMARY OF THE INVENTION

The object of the present invention is to provide a method as defined in the introduction, which makes it possible to better protect the susceptor so that its lifetime will be prolonged and crystal layers may be grown on the substrate without any detrimental influence of impurities from the susceptor, as well as a device for epitaxially growing said crystal by Chemical Vapor Deposition for carrying out such a method.

This object is, in accordance with the invention, obtained by placing a plate made of SiC, an alloy of SiC and the material grown or the material grown on the susceptor and arranging the substrate on the plate.

In the case of growing SiC and using a SiC-plate, although when the susceptor is partially or entirely coated by SiC as indicated above, the SiC coating of the susceptor surface underneath the SiC-plate may sublime and be deposited on the backside of the plate, it has been found that such deposition on the backside of the plate is much less pronounced than a deposition on the substrate backside when no plate is used. It has, at the same time, been noticed that hardly any sublimation from the SiC-plate to the substrate backside occurs, so that the backside of the substrate appears the same before and after epitaxial growth. Thus, as a result of the arrangement of the SiC-plate, the lifetime of the susceptor will be prolonged and the reliability of the epitaxial growth of SiC-layers on the substrate will be improved.

In the case of no SiC coating of the susceptor, the SiC-plate will also improve the function considerably by not letting any impurities from the susceptor through to the substrate, having these go around the plate. Although the invention leads to particularly good results when a plate of SiC is used when SiC is grown, the corresponding results may be obtained for the growth of a Group III-nitride, an alloy of Group III-nitrides or an alloy of such a nitride or nitrides and SiC when using one of a plate of SiC, an alloy of SiC and the material grown or the material grown.

According to a preferred embodiment of the invention, the plate is selected to extend substantially further in at least the upstream direction with respect to the feed of the gas mixture in the plane thereof than the substrate placed thereon, which means that possible etching of the SiC coating or another surface material of the susceptor will take place at a considerable distance to the substrate in the direction. Should there be any leakage of impurities from the susceptor, this will be at a considerable distance from the substrate and have much less influence on the epitaxial growth than before. According to another preferred embodiment, the plate is selected to extend substantially further in all directions in the plane thereof than the substrate placed thereon, so that the substrate is very efficiently and reliably protected from impurities escaping from the susceptor by reason of its being significantly smaller than the susceptor.

According to a further preferred embodiment of the invention, a plate of a high crystalline quality is applied on the susceptor which, in the case of a SiC coating on the susceptor, further reduces the deposition on the backside of the plate from the susceptor surface SiC coating and the deposition of the backside of the substrate from the plate.

According to another embodiment of the invention, the plate is made of or includes as a substantial component the material grown. This has been found to generate a catalytic effect, so that the plate enhance the decomposition of precursor gases, which is evidenced by an increased depletion of the precursor gases as the plate with compared to not using the plate. This catalytic effect makes it possible to decompose the precursor gases properly at a lower temperature than otherwise, so that the temperature in the reactor may be lowered and thereby impurities will not that easily leave their places in walls and the like, and come into the gas mixture above the substrate. In the case of using a plate of SiC when SiC is grown and such a plate of a high crystalline quality there is obtained, a decrease of the nitrogen incorporation in the grown layers, which may be a result of the catalytic effect of the SiC-plate, and a high crystalline quality of a plate made of or including as substantial component the material grown, will increase the catalytic effect.

According to a still further preferred embodiment of the invention, the plate is arranged on the bottom of a channel in a susceptor provided with a channel through which the gas mixture is intended to be fed, the walls of the susceptor surrounding the channel being are arranged to be heated. By combining the use of the plate and a susceptor having this constitution, the lifetime of a susceptor coated by SiC or another protective film may be further prolonged.

Further advantages and preferred features of the invention will appear from the following description and the other dependent claims.

BRIEF DESCRIPTION OF THE DRAWING

With reference to the appended drawing, there follows below a specific description of a preferred embodiment of the invention cited as an example.

In the drawing.

DETAILED DESCRIPTION OF THE PREFERRED EMBODIMENTS

Figure 1:
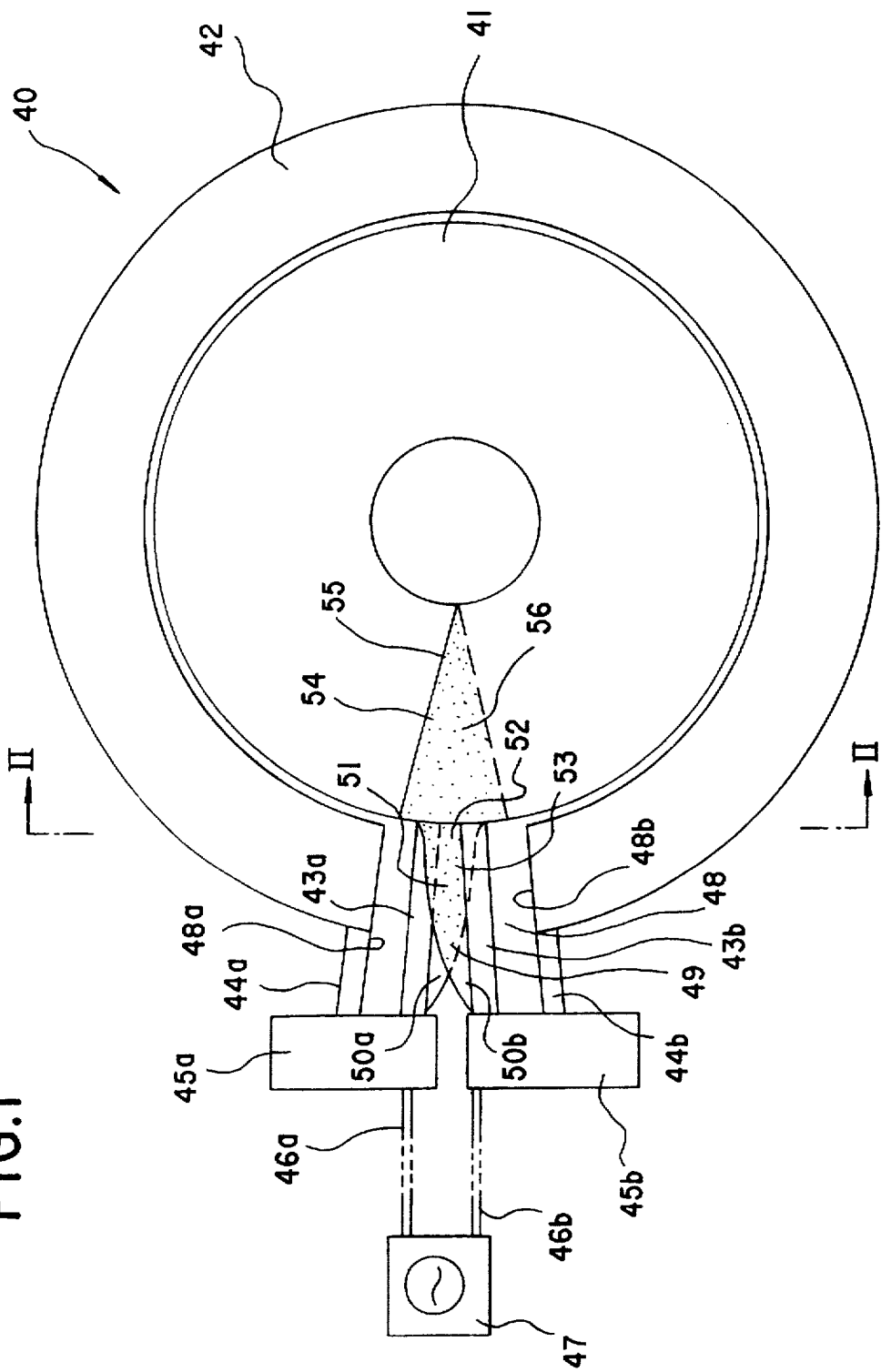
FIG. 1 is a longitudinal cross-section view of the device according to the invention.
Figure 1:
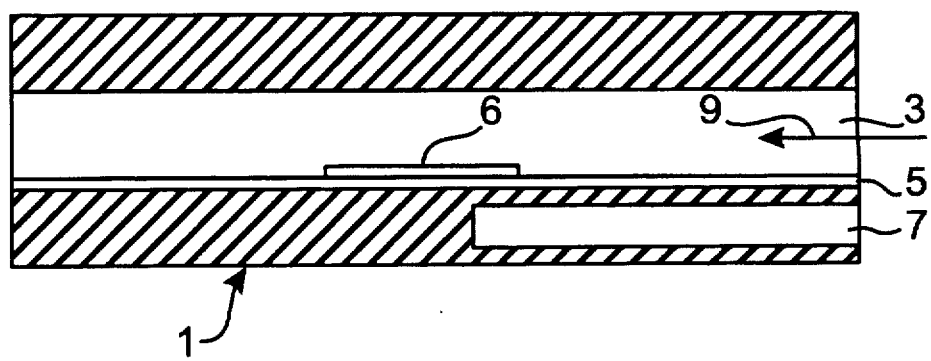

FIG. 1 shows a device according to a preferred embodiment of the invention for epitaxially growing SiC by Chemical Vapor Deposition on a SiC-substrate in a simplified manner. It is obvious that the device in question also may be formed of other means, such as pumps, conduits for supplying gases, a vacuum casing, heating means and so on, but this conventional equipment has nothing to do with the invention and thus has been omitted for the sake of clarity and concentration on the inventive characteristics.

The device comprises a susceptor 1 which, in this embodiment, is of graphite and coated by a thin SiC coating 2. The susceptor is provided with a channel 3 with surrounding walls 4. A SiC-plate 5 of high crystalline quality, looking as if it has been polished, is applied on the bottom surface of the channel 3, and a SiC-substrate is laid thereon for epitaxially growing SiC-layers on the top of the substrate.

Figure 2:
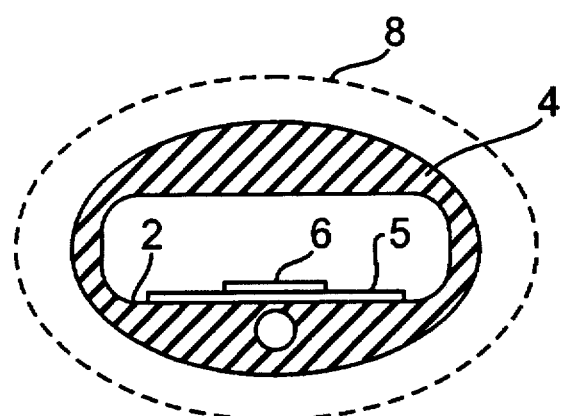
FIG. 2 is an end view from the right of the device according to FIG. 1.

The dimensions of the SiC-plate are in the two dimensional plane thereof substantially greater than the dimensions of the substrate 6, so that the substrate is located well within the outer limits of the plate 5. In a preferred embodiment the SiC-plate had a length of 100 mm, a width of 31 mm and a thickness of 1 mm, whereas the substrate had a length and width of about 15 mm and a thickness of 0.3 mm. The important feature is that the SiC-plate extends substantially further than the substrate in the upstream direction of the flow of a gas mixture used for the growth, since the resulting laminar flow used will only enable impurities from the susceptor to travel downstreams. The susceptor also has a recess 7 for facilitating the handling of the susceptor during introduction into, and removal out of, the vacuum casing in which the growth takes place. FIG. 2 indicates means 8 for heating the susceptor by induction, so that this may heat both the substrate 6 and a gas mixture introduced into the channel 3 for the growth procedure.

The device according to the invention is used to grow films of a thickness of 20–50 µm for the use in primarily high power semiconductor devices, and the operation of the device is as follows: a gas mixture is led through the channel 3 of the susceptor as indicated by the arrow 9. This gas mixture contains a $H_2$-carrier gas and C- and Si-containing precursor gases, preferably in the form of propane and silane. The heating means 8 will heat the susceptor 1 so that the substrate will acquire a temperature of 1500°–1700° C., preferably about 1550°, and the gas mixture introduced into the channel will be heated by dissipation of heat from the susceptor, which will result in a cracking of the precursor gases for formation of silicon- and carbon-atoms, which will then be deposited onto the surface of the SiC-substrate 6. There will be an equilibrium of deposition and sublimation of Si- and C-atoms near the inner wall surfaces of the channel 3 where the gas mixture reaches the channel surfaces. If the SiC-plate were not there, as in prior art devices, the temperature gradient between the susceptor and the substrate would result in a sublimation of the SiC coating of the susceptor underneath the substrate and deposition thereof on the backside of the somewhat colder substrate. This would, after a while, result in a leakage of hydrocarbons from the graphite as well as impurities present in the graphite, such as boron and aluminium, into the channel near the substrate. This would change the C/Si ratio near the surface of the substrate and thereby influence the good growth onto the substrate and an incorporation of the impurities in the epitaxial layers.

However, as a result of no change to the application of the SiC-plate 5 of high crystalline quality it has been possible to nearly eliminate the deposition of SiC on the backside of the SiC-plate through sublimation from the SiC coating of the susceptor thereunder. Additionally, the deposition on the backside of the substrate through sublimation of SiC from the SiC-plate thereunder is considerably reduced with respect to the deposition of SiC on the backside of the substrate in prior art devices. This means that the critical surfaces of the SiC coating of the susceptor will have a prolonged lifetime with respect to prior art devices, so that the risk for introduction of hydrocarbons or other impurities from the susceptor into the gas mixture will be reduced. Hydrogen etching of the susceptor has also only been noticed around the edges of the SiC-plate and accordingly at a non critical location. Furthermore, even if impurities were introduced, this would take place beside the SiC-plate 5 and accordingly far away from the substrate 6, so that the probability that they will be incorporated in the epitaxial layers will be much lower than before. Furthermore, it has been found that the SiC-plate 5 has a catalytic effect enhancing the decomposition of the precursor gases contained in the gas mixture. It is true that this leads to an increase of the depletion of the precursor gases with respect to no SiC-plate, but this can be overcome by a different susceptor profile if desired. However, the catalytic effect results in a better decomposition of the precursor gases at a given temperature, so that it would be possible to use a lower temperature for obtaining the decomposition aimed at, which lower temperatures, in turn, makes it more difficult for impurities to leave the walls of the reactor and enter into the gas mixture in the channel 3 of the susceptor.

The morphology of the grown layers is much improved by the use of the SiC-plate 5, which is believed to be due to the protection from the bare graphite and the catalytic effect which improves the decomposition of primarily the carbon precursors. It has also been found that the nitrogen incorporation in the grown layers is reduced when the SiC-plate 5 is used, from a typical nitrogen concentration of $10^{15}$ cm$^{-3}$ of the prior art to a few $10^{14}$ cm$^{-3}$ when the plate is used. This is probably a result of the catalytic effect of the SiC-plate.

Accordingly, the inventive use of a SiC-plate 5, together with a SiC-coated graphite susceptor, improves the impurity of the epitaxial layers with respect to unwanted impurities coming from the graphite susceptor and the nitrogen donors. These advantages would also be there if a non-coated susceptor of graphite or metal or a SiC-coated susceptor of metal were used. Additionally, the lifetime of the susceptor will be prolonged and the morphology of the grown layers will be greatly improved.

The invention is, of course, not in any way restricted to the preferred embodiment of the device and method described above, but several possibilities of modifications thereof will be apparent for a one skilled in the art without departing from the basic idea of the invention.

As already mentioned, the invention is also applicable to the growth of a Group III-nitride, an alloy of Group III-nitrides, or an alloy of SiC and one or more Group III-nitrides, and will lead to the corresponding positive influence of the inventive concept upon the quality of the epitaxial layers grown thereof.

The susceptor may have different shapes and dimensions than mentioned above, and the invention is also applicable to a cold wall susceptor, although the temperature gradient, and thereby the sublimation of SiC from the SiC coating of the susceptor will then be increased if present.

The plate may also have other dimensions and also other proportions with respect to the substrate than shown in the preferred embodiment, and "plate" as defined in the claims is to be interpreted in its broadest sense and include all types of structures having a surface onto which a substrate may be placed. It would for instance be possible to make the plate as a hollow beam-piece introduced into the susceptor and protecting great parts of the susceptor surfaces, although impurities from the "ceiling" of the channel would be hardly any problem if the distance between this and the substrate exceeds 10 mm.

Plate of "high crystalline quality" means that the plate has a high purity, but it does not have to be a pure single crystal, but may have monocrystalline regions.

In the case of a SiC-plate, "SiC-plate" does not mean that the plate composed of SiC molecules, but it may be manufactured by sintering C- and Si-powder and then acquired C/Si ratio other than 1:1. For example a ratio of 40:60 is conceivable. "SiC" as defined in the claims with respect to the plate material means that the plate consists substantially only of SiC; however, smaller amounts of other compounds, such as Group III-nitrides, may be mixed therewith.

The substrate may be of another material than SiC, such as Group III-nitrides.

Furthermore, the important character of the plate material is a low diffusivity at the temperatures used for the growth and a high purity. This is especially well obtainable by a plate of SiC, but the invention also comprises plates of alloys of SiC, and the material grown, which may further comprise one or several Group III-nitrides, or the material grown.

We claim:

1. A method for protecting a susceptor when SiC, a Group III-nitride or alloys thereof, is epitaxially grown by Chemical Vapor Deposition on a substrate arranged on a surface of the susceptor said method comprising the steps of:

heating the susceptor and thus said substrate and a gas mixture fed to the substrate for said growth;

placing a plate made of SiC, an alloy of SiC and the material grown, or the material grown, on the susceptor; and arranging the substrate on said plate.

2. The method according to claim 1, wherein SiC is epitaxially grown in said susceptor and wherein the plate is made of SiC.

3. A method according to claim 1, wherein said plate is dimensioned to extend substantially further in at least the upstream direction with respect to the feed of said gas mixture in the plane thereof than the substrate located thereon.

4. A method according to claim 3, wherein said plate is dimensioned to extend substantially further in all directions in the plane thereof than the substrate placed thereon.

5. A method according to claim 1, wherein said plate is of a high crystalline quality.

6. A method according to claim 1, wherein said plate is substantially thicker than a SiC-layer coated on the susceptor.

7. A method according to claim 1, wherein the plate is arranged on the bottom of a channel provided in said susceptor through which said gas mixture is intended to be fed, the walls of the susceptor surrounding said channel being heated.

8. A method according to claim 1, wherein said susceptor is of graphite covered by a protective SiC-layer.

9. A method according to claim 1, wherein said plate is made of, or includes as a substantial component, the material grown.

10. A device for epitaxially growing SiC, a Group III-nitride, or alloys thereof by Chemical Vapor Deposition on a substrate comprising:

a susceptor adapted to receive said substrate on a surface thereof;

means for heating the susceptor and thereby the substrate and a gas mixture fed to the substrate for the growth; and a plate made of SiC, an alloy of SiC and the material grown, or the material grown, said plate being applied on the surface of the susceptor, and adapted to receive the substrate on the top thereof.

11. A device according to claim 10, wherein SiC is epitaxially grown in the susceptor and the plate is a SiC-plate.

12. A device according to claim 10, wherein the plate is arranged to extend further, in at least the upstream direction with respect to the feed of said gas mixture in the plane thereof, than a substrate to be received on the plate.

13. A device according to claim 12, wherein the plate is arranged to extend substantially further, in all directions in the plane thereof, than a substrate to be received on the plate.

14. A device according to claim 10, wherein the plate is of a high crystalline quality.

15. A device according to claim 10, wherein the plate is substantially thicker than a SiC-layer coated on the susceptor.

16. A device according to claim 10, wherein the susceptor is provided with a channel through which said gas mixture is intended to be fed, said heating means being adapted to heat the walls of the susceptor surrounding said channel, and the plate is located on the bottom of said channel.

17. A device according to claim 10, wherein the susceptor is made of graphite coated by a protective SiC-layer.

18. A device according to claim 10, wherein said plate is made of, or includes as a substantial component, the material grown.

* * * * *

UNITED STATES PATENT AND TRADEMARK OFFICE
CERTIFICATE OF CORRECTION

PATENT NO. : 5,792,257
DATED : August 11, 1998
INVENTOR(S) : Olle Kordina, Shrister Hallin, Erik Janzén It is certified that error appears in the above-identified patent and that said Letters Patent is hereby corrected as shown below:

Please replace the current Fig. 1 with the attached Figs. 1 and 2.

Signed and Sealed this

Sixteenth Day of October, 2001

*Attest:*

*Attesting Officer*

NICHOLAS P. GODICI
*Acting Director of the United States Patent and Trademark Office*